United States Patent [19]
Ura

[11] Patent Number: 5,773,857
[45] Date of Patent: Jun. 30, 1998

[54] SEMICONDUCTOR DEVICE HAVING DUMMY WIRING CONDUCTORS FOR SUPPRESSING HEAT-TREATMENT-INDUCED SHIFTING

[75] Inventor: Kenji Ura, Tokyo, Japan

[73] Assignee: NEC Corporation, Tokyo, Japan

[21] Appl. No.: 749,855

[22] Filed: Nov. 15, 1996

[30]     Foreign Application Priority Data

Nov. 15, 1995  [JP]  Japan ..................................... 7-296552

[51] Int. Cl.$^6$ ................................................... H01L 27/10
[52] U.S. Cl. ......................... 257/211; 257/210; 257/324; 257/773
[58] Field of Search ................................... 257/210, 211, 257/324, 773

[56]               References Cited

U.S. PATENT DOCUMENTS

| | | | |
|---|---|---|---|
| 4,544,238 | 10/1985 | Nickol | 350/336 |
| 4,916,514 | 4/1990 | Nowak | 257/773 |
| 5,251,168 | 10/1993 | Chung et al. | 365/51 |
| 5,441,915 | 8/1995 | Lee | 257/211 |

FOREIGN PATENT DOCUMENTS 61-194771  8/1986  Japan .

4-348054  12/1992  Japan .

Primary Examiner—Valencia Martin Wallace
Attorney, Agent, or Firm—Sughrue, Mion, Zinn, Macpeak & Seas, PLLC

[57]               ABSTRACT

In a semiconductor device having a repetitive pattern area in which a unitary wiring pattern is repeatedly arranged and covered with a multilayer insulator film composed of a silicon oxide film and a TEOSBPSG film, dummy conductors formed of the same layer as that of conductors of the wiring pattern are formed in an area adjacent to an edge zone of the repetitive pattern area. Thus, the outermost conductor positioned at the edge of the repetitive pattern area is no longer the outermost patterned conductor in an extended repetitive pattern area including the dummy conductors. Thus, the stress which acts on the outermost conductor of the repetitive pattern area because of the shrinkage of the silicon oxide film caused for the difference in thermal shrinkage coefficient between the silicon oxide film and the TEOSBPSG film, is relaxed, so that the shifting of the outermost conductor is prevented, and therefore, a short-circuiting caused by shifting of the outermost conductor is also prevented.

18 Claims, 8 Drawing Sheets

SEMICONDUCTOR DEVICE HAVING DUMMY WIRING CONDUCTORS FOR SUPPRESSING HEAT-TREATMENT-INDUCED SHIFTING

BACKGROUND OF THE INVENTION

1. Field of the Invention

The present invention relates to a semiconductor device, and more specifically, to an improvement to a semiconductor device having different interlayer insulator films stacked on a wiring conductor layer and having a peripheral area having no wiring conductor adjacent to a wiring conductor repeating area.

2. Description of Related Art

A semiconductor device has an interlayer insulator film formed to cover a patterned wiring conductor layer, and in some cases, the interlayer insulator film is formed of a plurality of stacked different insulator films. For example, in semiconductor devices having a production yield lowered because of advanced micro-fabrication of a device pattern and a wiring pattern, a redundant construction is adopted in which a defective memory cell, a defective row or a defective column is replaced with a spare element, row or column. Conventionally, substitution of the spare element for the defective memory cell is realized by melting off a fuse by a laser beam or the like to change a circuit connection. In the case that this fuse is formed of a lower level wiring conductor layer, if the fuse was covered with a thick insulator film, it becomes difficult to completely melt off the fuse because an energy of the laser beam is absorbed by the thick insulator film. On the other hand, if the fuse was exposed, it becomes easy to melt off the fuse, however, there occurs a fear that the molten-off fuse is short-circuited by moisture entering the device, with the result that reliability drops.

Therefore, it is preferred to form a suitable thickness of insulator film on the fuse. It is a general practice to control the thickness of the insulator film formed on the fuse on the order of 1000 Å. In order to easily control the insulator film thickness, it is the typical prior art practice to form two layers of insulator film on the fuse.

Referring to FIG. 1, there is shown a diagrammatic sectional view of one example of the prior art semiconductor device having the fuse for substitution of a spare element for a defective element. In the shown device, in a device formation region of a silicon substrate 1 confined by a device isolation oxide 3, there is formed a transistor constituted of a pair of impurity diffused regions 2, and a gate oxide film 4A and a gate electrode 4B stacked in the named order on a region between the pair of impurity regions 2. Thereafter, a TEOSBPSG (tetraethoxysilane (Si(OC$_2$H$_5$)$_4$) borophosphosilicate glass) film 5 is deposited, and then, heat-treated for planarization. Furthermore, a tungsten silicide film of about 2000 Å in thickness, which will become a lower level wiring conductor layer, is formed on the TEOSBPSG film 5, and then, patterned into a predetermined shape so as to form a fuse 6X which is formed of a portion of the lower level wiring conductor layer.

Succeedingly, a silicon oxide film 7 of about 1500 Å in thickness is formed to cover the fuse 6X and the TEOSBPSG film 5, and another TEOSBPSG film 8 of about 5000 Å in thickness is deposited on the silicon oxide film 7, so that an interlayer insulator film of a multilayer structure is formed. Furthermore, a heat-treatment is carried out for the purpose of a reflow of the surface, and then, if necessary, a contact hole for connecting between a possible upper level wiring conductor layer and the underlying substrate (such as the impurity diffused region 2) or the lower level wiring conductor layer is formed by a well-known photolithography. An aluminum wiring conductor layer having a thickness on the order of 9000 Å is formed on an area including the contact hole, and then patterned to form an upper level wiring conductor layer 9. Furthermore, a protection film 10 is formed on the whole surface in order to elevate a moisture resistance property. Then, in a processing of etching an aperture in the protection film above an aluminum pad (not shown), the insulator film above the fuse 6X is also etched to form an aperture 11.

In the process of forming the aperture 11, the etching rate of the TEOSBPSG film 8 is on the order of 600~700 Å/min, and on the other hand, the etching rate of the silicon oxide film 7 is on the order of 400~500 Å/min. Therefore, even if the etching time is longer than a proper time by some degree, since the silicon oxide film 7 acts as one kind of stopper, it is possible to relatively easily control the film thickness of the insulator film above the fuse 6X. Thus, the fuse 6X is certainly prevented from being exposed, while it becomes easy to melt off the fuse 6X by means of a laser beam.

However, a problem has been encountered in the semiconductor device manufactured in the above mentioned process. In the heat treatment step for the reflow, the silicon oxide film 7 is shrunk because of a difference in a thermal shrinkage coefficient between the TEOSBPSG film 8 and the silicon oxide film 7, so that a stress generated by shrinkage of the silicon oxide film 7 acts on the lower level wiring conductor layer 6, with the result that a conductor formed of the lower level wiring conductor layer (corresponding to the fuse 6X) is caused to move in a plane direction, to often become close to or into contact with (namely, into electrical short-circuit with) an adjacent wiring conductor, for example, the contact. Particularly, in a semiconductor memory having a sense amplifier area, a register area and a decoder area provided adjacent to a memory cell area, this phenomenon easily occurs in an periphery of the memory cell area, namely, in an edge zone of an area in which the same pattern is repeated.

A study of the inventor of the present invention found that, the nearer it becomes to the edge of the repetitive pattern area, the larger the amount of shift caused by the stress becomes. For example, when there was formed a repetitive pattern area in which the same pattern is repeated fifteen times, almost no shift occurred at the inside of the repetitive pattern area, but the amount of shift was large at an outer edge zone of the repetitive pattern area. In addition, it was found that if a unitary or elementary repetitive pattern long and thin, the shift becomes occurs more easily.

The reason for this is considered as follows: Since an area which does not have a pattern having a function of buffering or relaxing the stress extends at an outside of the repetitive pattern area, the generated stress directly acts on the pattern in the edge zone of the repetitive pattern area, thereby to shift the pattern in the edge zone. On the other hand, since the pattern of the edge zone is shifted, the generated stress is buffered or relaxed, so that the amount of shift gradually decreases from the edge zone toward the center zone of of the repetitive pattern area.

In the repetitive pattern area, since the upper level wiring conductor is connected through the contact hole to the underlying substrate or the lower level wiring conductor, the contact hole pattern is fixed in relation to the underlying substrate. In this connection, it is considered that, if an interval between adjacent contact holes is large, the shift occurs in an area between the adjacent contact holes, and the amount of shift increases with a distance from the contact hole. Therefore, it is generally considered that the shift easily occurs in a long and thin pattern in which an area including no contact hole inevitably becomes long.

Referring to FIG. 2, there is shown a layout pattern diagram of one example of the repetitive pattern area, and a sectional view taken along the line B—B in FIG. 2 is shown in FIG. 3. In these drawings, elements similar to those shown in FIG. 1 are given the same Reference Numerals, and explanation thereof will be omitted for simplification of description.

As shown in FIG. 2, elongated patterned wiring conductors 6A, 6B and 6C formed of tungsten silicide is provided to cross over the transistors. These elongated patterned wiring conductors 6A, 6B and 6C have no contact hole fixed to the underlying layer or substrate, as seen from in FIGS. 2 and 3. In addition, the shown pattern is repeated toward the left side direction in the drawing, so that the patterned wiring conductor 6C is positioned in an edge of the repetitive pattern area. In addition, an area having no patterned layer formed of the same (lower level wiring conductor) layer as the patterned wiring conductor 6C extends at a right side of the patterned wiring conductor 6C. Furthermore, the contact formed of the upper level aluminum wiring 9 and connected to the impurity diffused region 2 is formed between the patterned wiring conductors 6B and 6C.

Referring to FIG. 4, there is shown a view similar to the sectional view of FIG. 3 but illustrating that the patterned wiring conductor is shifted because of the stress. The patterned wiring conductors 6B and 6C are shifted in a right-hand direction in FIG. 4. As a result, the patterned wiring conductor 6B is extremely close to the contact hole 9 as shown in FIG. 4, and in some cases, short-circuits with the contact hole 9.

In order to prevent the shift of the patterned wiring conductor, Japanese Patent Application Pre-examination Laid-open Publication No. JP-A-4-348054 proposes to intentionally provide grooves in the underlying insulating film and to form the wiring conductor layer on the underlying insulating film in such a manner that a portion of the wiring conductor layer snaps into the grooves formed in the underlying insulating film. Referring to FIG. 5A, there is a layout pattern diagram shown in JP-A-4-348054, and a diagrammatic sectional view taken along the line C—C in FIG. 5A is shown in FIG. 5B.

As shown in FIGS. 5A and 5B, grooves 24 are formed, by use of a conventional contact hole forming technology, on a BPSG film 23 formed on a field oxide film 22 formed on a silicon substrate 21, and a wiring conductor layer 25 is formed on the BPSG film 23 having the grooves 24. A portion of the wiring conductor layer 25 enters the grooves 24, so that the wiring conductor layer 25 is anchored or fixed to the BPSG film 23 at the position of the grooves 24.

In this technology, however, if a lower level wiring conductor layer 26 exists under an area of the BPSG film 23 where the groove 24 is to be formed, the wiring conductor layer 25 becomes easy to short-circuit with the lower level wiring conductor layer 26. Accordingly, it is difficult to form an element such as a transistor under the grooves 24. In particular, since elements are located with a very high density in the above mentioned sense amplifier area, register area and decoder area, if the grooves were formed in these areas, the integration density of the semiconductor memory drops remarkably.

SUMMARY OF THE INVENTION

Accordingly, it is an object of the present invention to provide a semiconductor device which has overcome the above mentioned defect of the conventional one.

Another object of the present invention is to provide a semiconductor device capable of preventing the shifting of the patterned wiring conductors in an edge zone of a wiring pattern repeating area, thereby to prevent the short-circuiting of the patterned wiring conductors.

The above and other objects of the present invention are achieved in accordance with the present invention by a semiconductor device having a repetitive pattern area in which unitary wiring patterns are repeatedly arranged and covered with a plurality of insulator films, wherein the improvement is that a plurality of dummy conductors formed of the same layer as that of a conductor of the wiring pattern are formed in an area adjacent to an edge zone of the repetitive pattern area.

In one embodiment, the plurality of insulator films are constituted of a stacked layer of a silicon oxide film and a TEOSBPSG film, respectively. The dummy conductors are formed of the same wiring material as that of the conductor of the wiring pattern.

The above and other objects, features and advantages of the present invention will be apparent from the following description of a preferred embodiment of the invention with reference to the accompanying drawings.

DESCRIPTION OF THE PREFERRED EMBODIMENT

Figure 6:
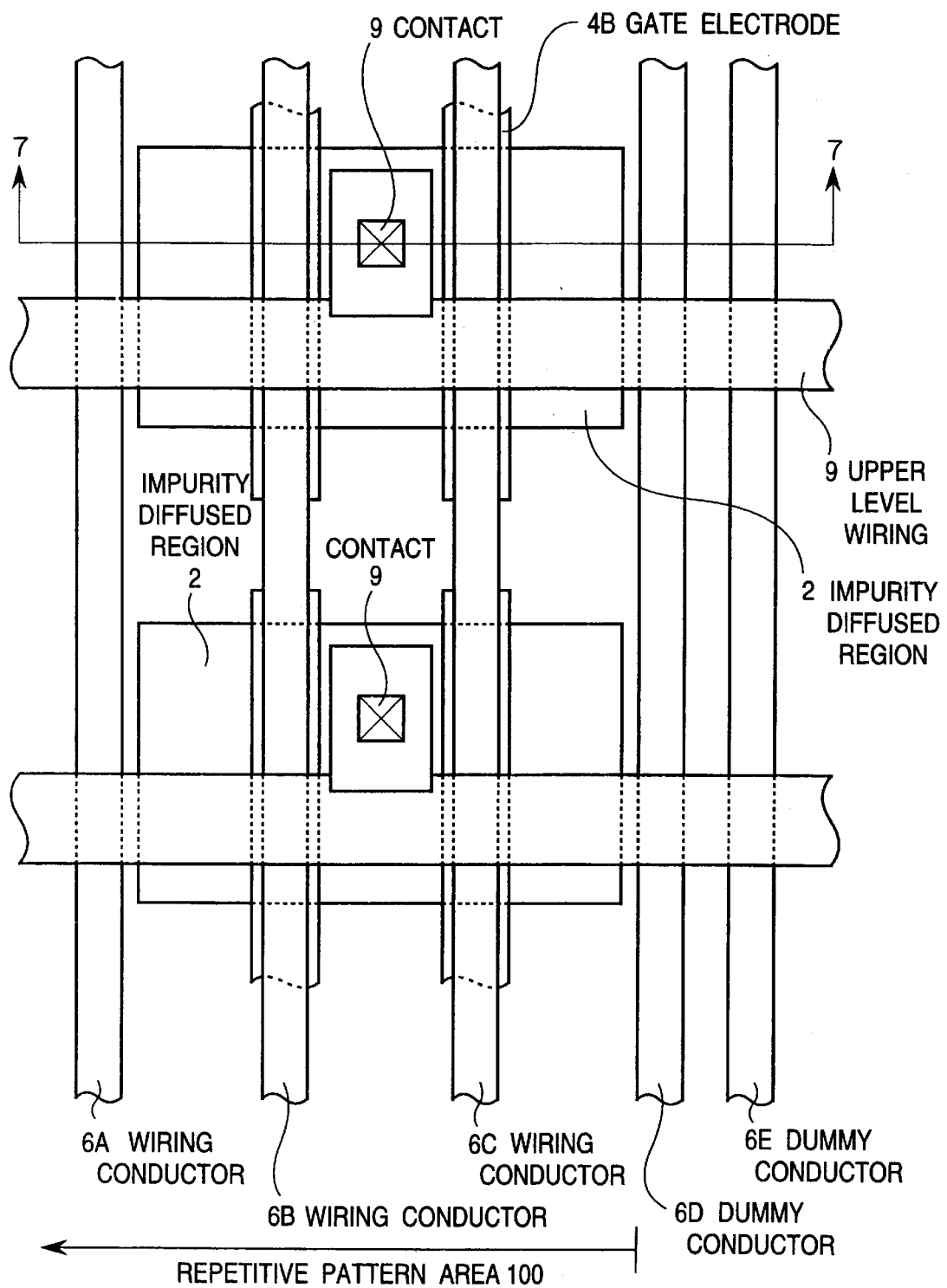
FIG. 6 is a layout pattern diagram of the repetitive pattern area in one embodiment of the semiconductor device in accordance with the present invention.

Now, an embodiment of the semiconductor device in accordance with the present invention will be described with reference to FIGS. 6 and 7. FIG. 6 is a layout pattern diagram of the repetitive pattern area in the embodiment of the semiconductor device, and FIG. 7 is a sectional view taken along the line A—A in FIG. 6.

Figure 7:
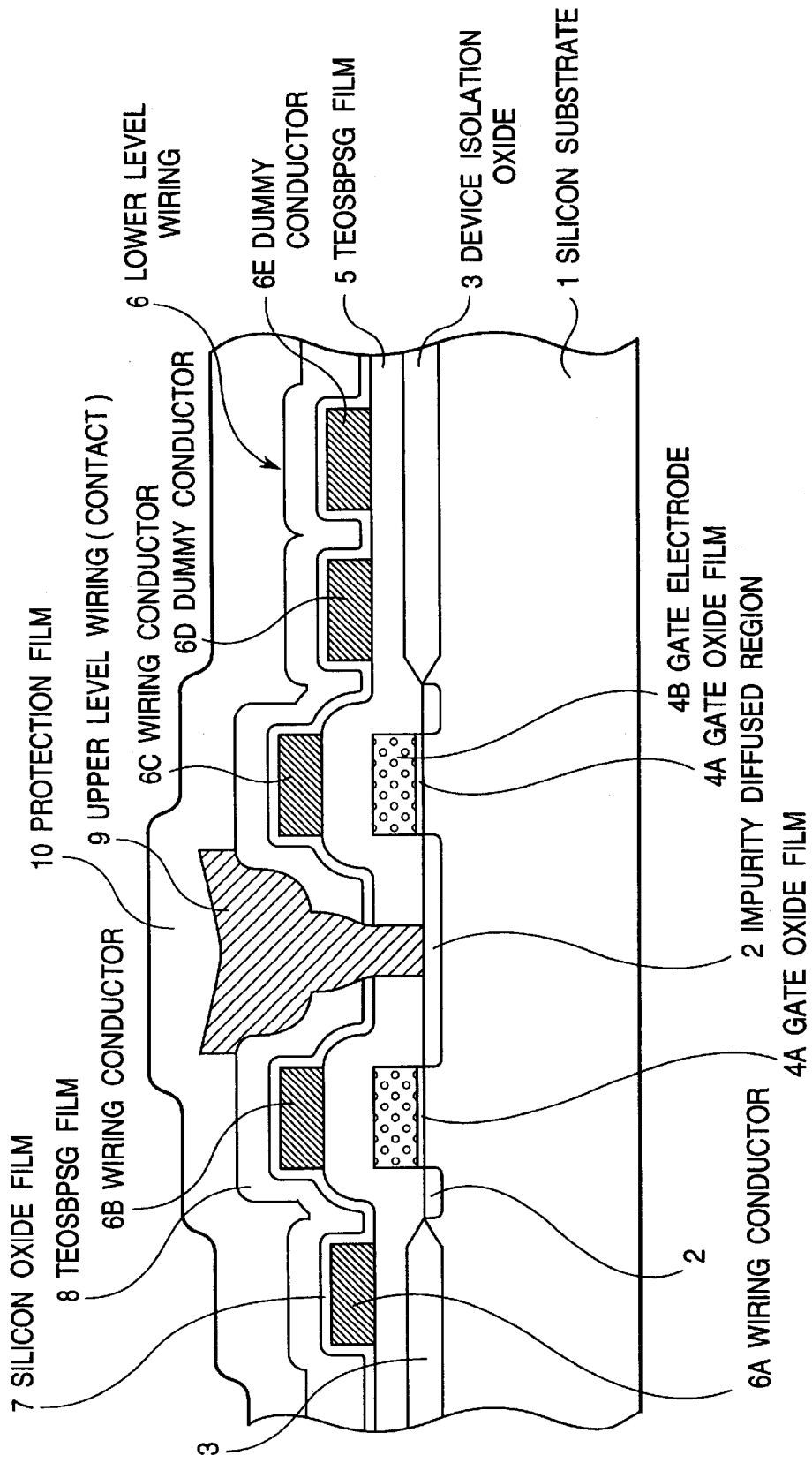
FIG. 7 is a sectional view taken along the line A—A in FIG. 6.

As shown in FIG. 7, a device isolation oxide film 3 is formed to confine a device formation region on a principal surface of a silicon substrate 1. A gate oxide film and a polysilicon film are deposited in the named order on the principal surface of the silicon substrate 1, and then, selectively etched to form a gate oxide film 4A and a gate electrode 4B within the device formation region. In addition, by introducing impurity into the principal surface of the silicon substrate 1 by using the gate electrode 4B as a mask, a pair of impurity diffused regions 2 are formed at opposite sides of the gate electrodes as source/drain regions. Thus, a MOSFET is formed.

Thereafter, a TEOSBPSG film 5 is deposited on the whole surface, and then, heat-treated for planarization. Furthermore, a tungsten silicide film of about 2000 Å in thickness, which will become a lower level wiring conductor layer, is formed on the TEOSBPSG film 5, and then, patterned into a predetermined shape so as to form a plurality of patterned wiring conductors 6A to 6C and patterned dummy conductors 6D and 6E and a fuse 6X (not shown in FIGS. 6 and 7 but as shown in FIG. 1), all of which are accordingly formed of a portion of the lower level wiring conductor layer.

Succeedingly, a silicon oxide film 7 of about 1500 Å in thickness is formed to cover the patterned conductors 6A to 6E and the fuse 6X and the TEOSBPSG film 5, and another TEOSBPSG film 8 of about 5000 Å in thickness is deposited on the silicon oxide film 7, so that an interlayer insulator film of a multilayer structure is formed. Furthermore, a heat-treatment is carried out for the purpose of a reflow of the surface, and then, if necessary, a contact hole for connecting between a possible upper level wiring conductor layer and the underlying substrate (such as the impurity diffused region 2) or the lower level wiring conductor layer is formed by a well-known photolithography. An aluminum wiring conductor layer having a thickness on the order of 9000 Å is formed on an area including the contact hole, and then patterned to form an upper level wiring conductor layer 9. Furthermore, a protection film 10 is formed on the whole surface in order to elevate a moisture resistance property.

Figure 1:
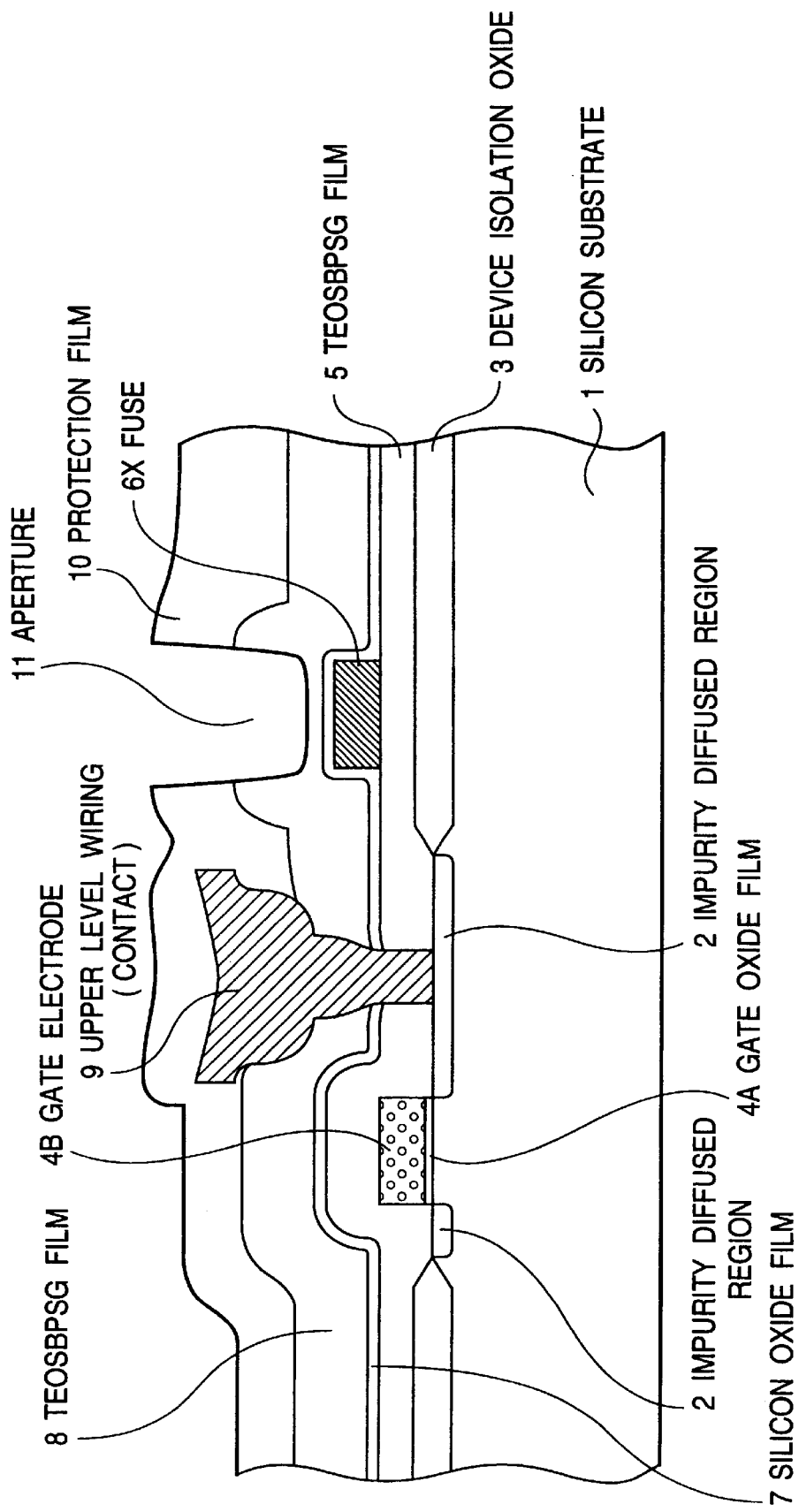
FIG. 1 is a diagrammatic sectional view of one example of the prior art semiconductor device having the fuse for substitution of a spare element for a defective element.

Thereafter, in a processing of etching an aperture in the protection film above an aluminum pad (not shown), the protection film 10 above the fuse 6X is also selectively etched and the underlying TEOSBPSG film 8 is selectively etched to a predetermined depth, to form an aperture 11 for melting off the fuse, as shown in FIG. 1.

Figure 2:
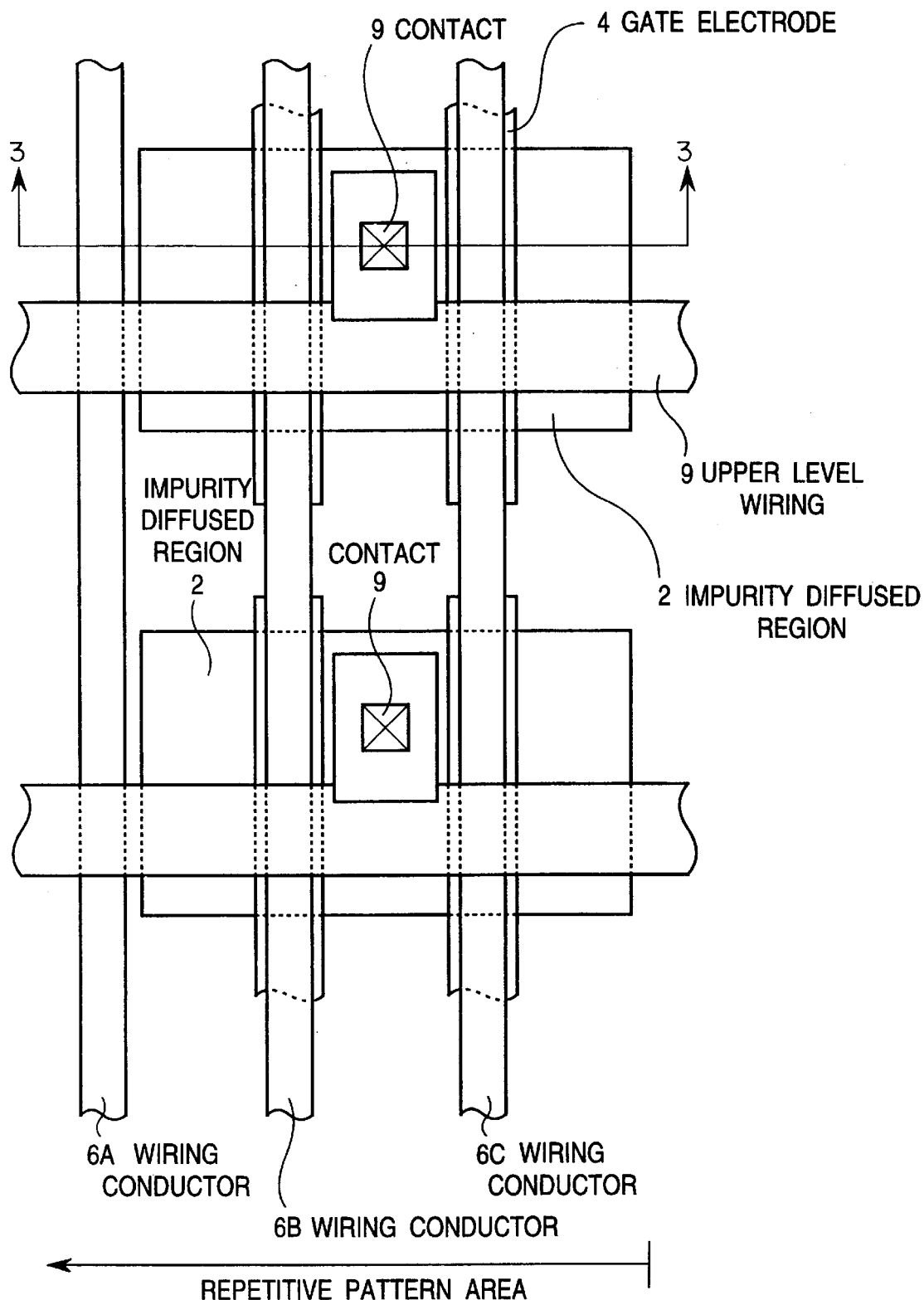
FIG. 2 is a layout pattern diagram of one example of the repetitive pattern area.
Figure 3:
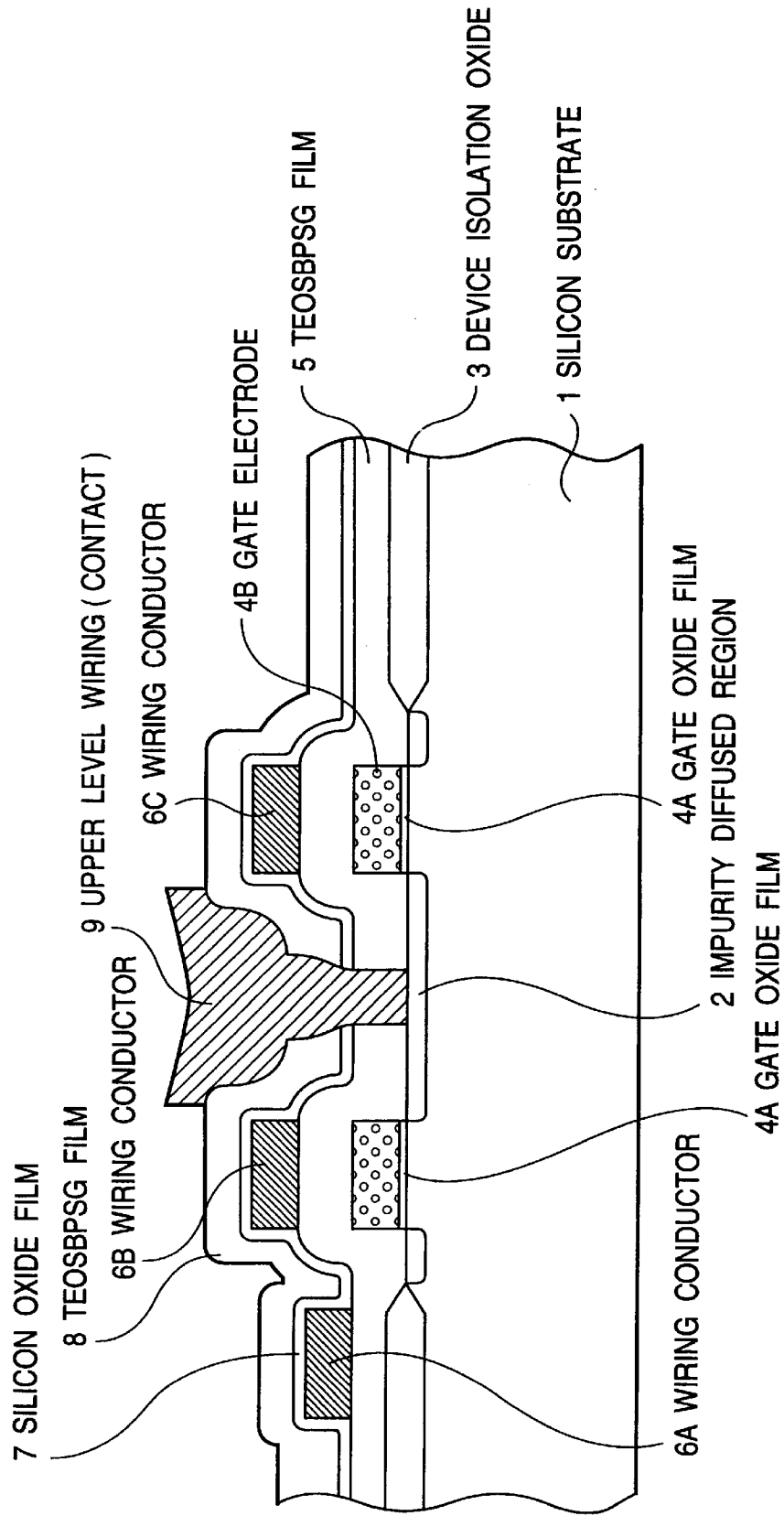
FIG. 3 is a diagrammatic sectional view taken along the line B—B in FIG. 2.
Figure 4:
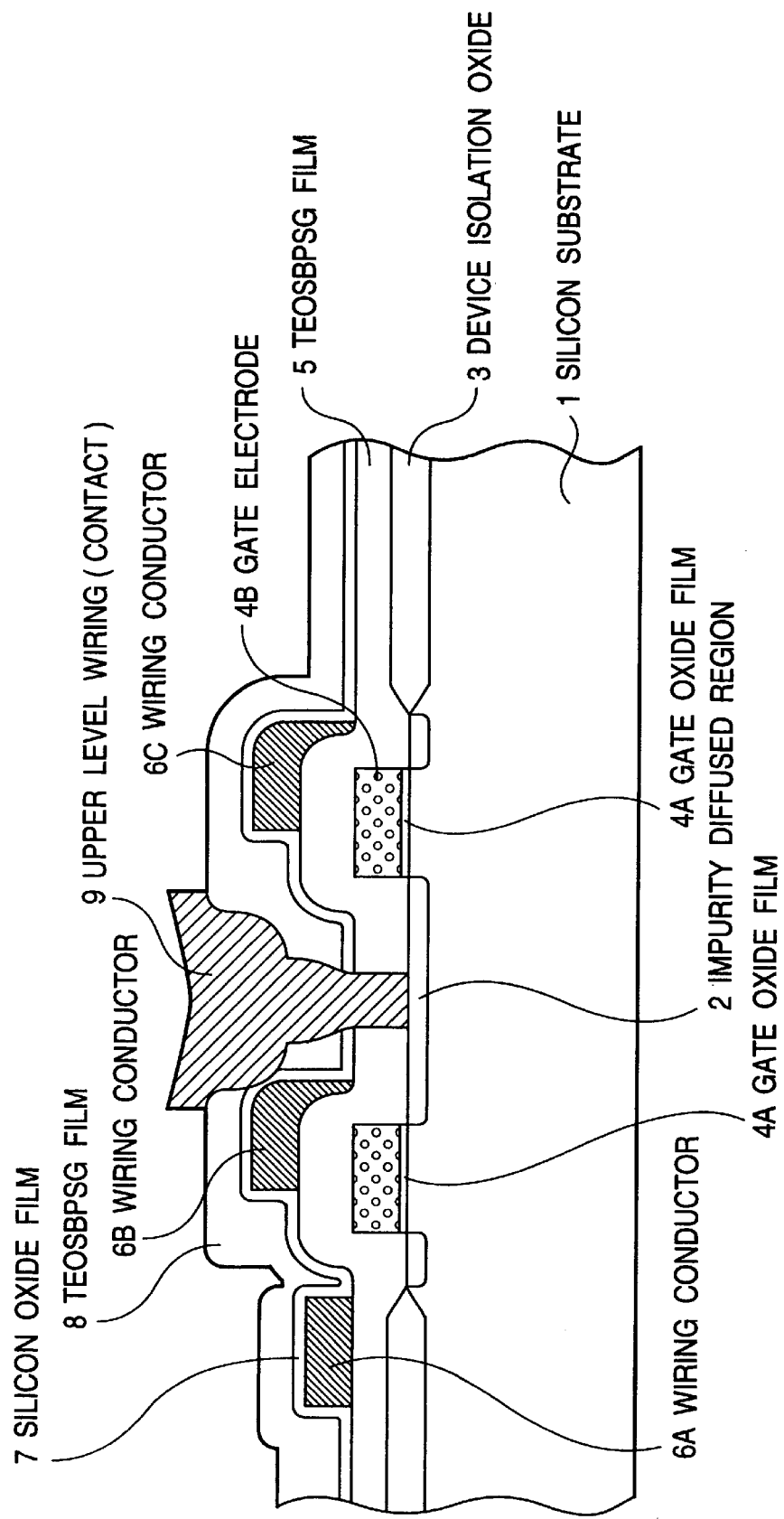
FIG. 4 is a view similar to the view of FIG. 3 but illustrating that the patterned wiring conductors are shifted because of the stress.
Figure 5A:
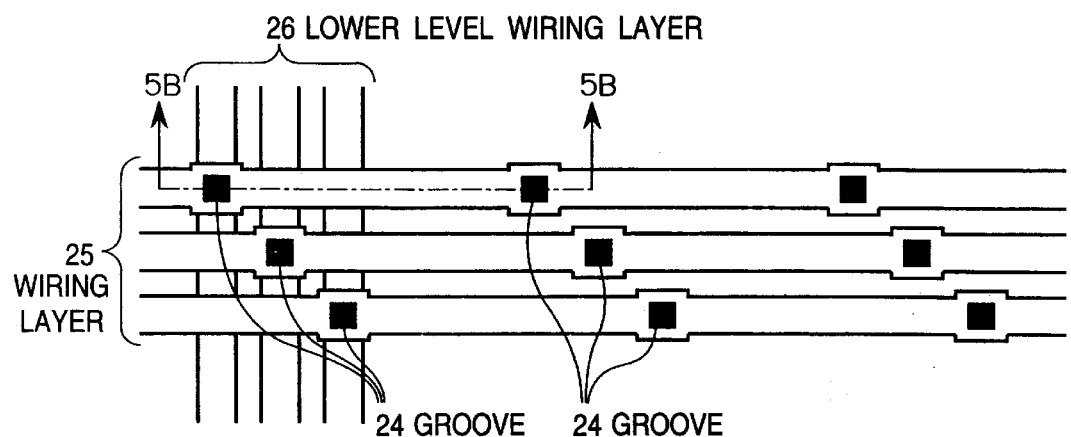
FIG. 5A is a layout pattern diagram of a prior art example for preventing the shifting of the wiring conductor.
Figure 5B:
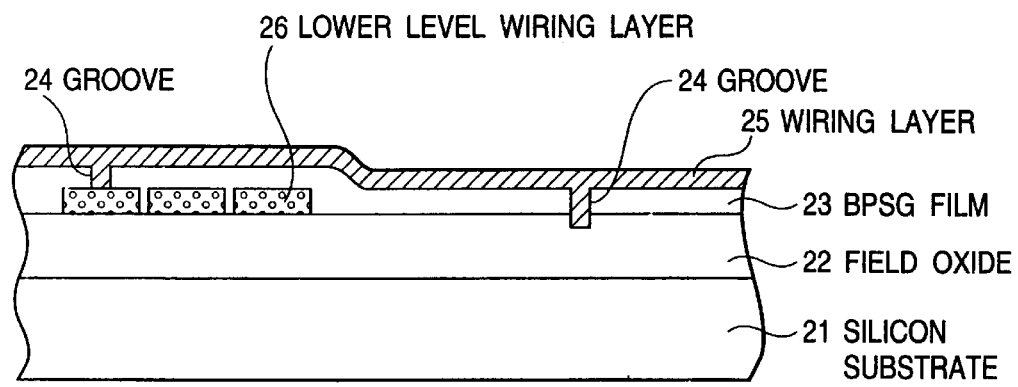
FIG. 5B is a diagrammatic sectional view taken along the line C—C in FIG. 5A.

As seen from comparison between FIGS. 2 and 6, in the shown embodiment of the semiconductor device, the patterned wiring conductors 6A to 6C in a repetitive pattern area 100 are formed of the lower level wiring conductor layer of the tungsten silicide which is used to form the fuse 6X, similarly to the prior art example shown in FIG. 2, and in addition, the patterned dummy conductors 6D and 6E formed of the tungsten silicide of the lower level wiring conductor layer but having no relation to a circuit operation of the semiconductor device, are located in a peripheral zone adjacent to the repetitive pattern area 100 and extending at the outside of the repetitive pattern area 100. In the shown embodiment, the patterned dummy conductors 6D and 6E have the same width as that of the patterned wiring conductors 6A to 6C, and are located to extend in parallel to the patterned wiring conductors 6A to 6C.

Accordingly, with the above mentioned arrangement, in the heat-treatment step for reflow before forming an upper level wiring conductor layer as mentioned hereinbefore, a stress is likely to act on the lower level wiring conductor layer (corresponding to the conductors 6A to 6E and the fuse 6X) by action of the shrinkage of the silicon oxide film 7 caused because of a difference in a thermal shrinkage coefficient between the TEOSBPSG film 8 and the silicon oxide film 7, but since the patterned dummy conductors 6D and 6E are formed adjacent to the patterned wiring conductor 6C, the pattern wiring conductor 6C positioned at an edge of the repetitive wiring pattern area 100 is no longer the outermost patterned conductor of an extended repetitive pattern area which includes the patterned dummy conductors 6D and 6E, so that the shift of the patterned wiring conductor which easily occurs at an edge zone of a repetitive pattern area is prevented in the proximity of the patterned wiring conductor 6C.

The reason for this is considered that such a situation that an area which does not have a pattern having a function of buffering or relaxing the stress does not exist at an outside of the repetitive pattern area, is eliminated by the provision of the patterned dummy conductors 6D and 6E, with the result that the stress acting on the patterned wiring conductors 6A, 6B and 6C are buffered or relaxed in an equal condition, so that the generation of the shifting is suppressed.

Incidentally, the effect of buffering or relaxing the stress by action of the dummy conductors 6D and 6E can be enhanced if the dummy conductors 6D and 6E themselves are shifted to absorb the stress. Therefore, the dummy conductors 6D and 6E are preferred to be as thin as possible. In particular, if the ratio of width to length is made not greater than 1:20, this effect can be made more effective.

Figure 8:
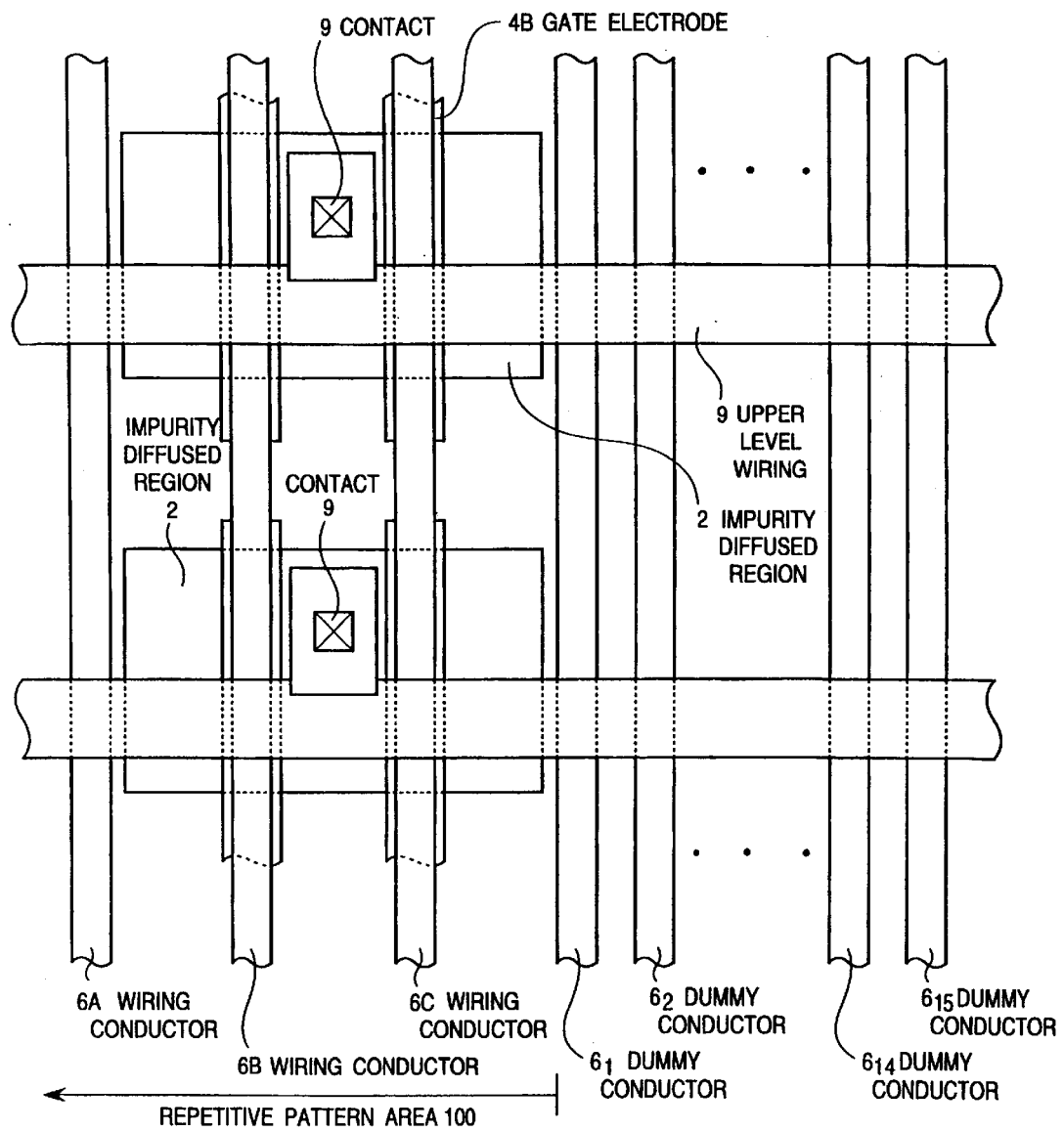
FIG. 8 is a layout pattern diagram showing the presence of fifteen dummy wiring conductors in the peripheral zone.

The shown embodiment includes two dummy conductors located in parallel, but the number of dummy conductors is in no way limited to the shown embodiment, and can be freely selected in accordance with a necessity. However, the inventor confirmed that, in a repetitive pattern area, no shift occurs at an inside of a zone in which fifteen patterned wiring conductors are located in parallel. Therefore, it is considered that, the shifting can be prevented almost completely if 15 dummy conductors, ($6_{1-615}$) preferably, 20 dummy conductors are located (see FIG. 8). In addition, the dummy conductors may be formed of a material different from that of the patterned wiring conductors, but is preferred to be formed of the same material as that of the patterned wiring conductors, in order to emphasize the stress relaxing effect.

Furthermore, from a basic conception it is considered to be sufficient if the dummy conductors are provided to cover a peripheral zone which extends at the outside of the repetitive pattern area. It is sufficient if the dummy conductors are located to avoid an area in which patterned wiring conductors of the same layer as that of the patterned wiring conductors of the repetitive pattern area are located. In addition, the dummy conductors can be connected to any fixed potential, for example, a ground potential or a fixed potential equal to one half of a power supply voltage, in order to prevent the dummy conductors from giving an adverse influence such as noise to the patterned wiring conductors. Additionally, the present invention is in no way limited to the semiconductor device having the fuse, and can be applied to any conventional semiconductor devices.

Incidentally, a technology for forming a dummy pattern is disclosed by for example Japanese Patent Application Pre-examination Laid-open Publication No. JP-A-61-194771. However, this is intended to relax a surface step occurring between a memory cell area and an adjacent area in a semiconductor device, by forming a dummy pattern in the adjacent area so as to planarize the whole. In addition, U.S. Pat. No. 5,251,168 proposes to locate dummy cells to surround a memory cell area. These dummy cells are provided to prevent leakage of memory cells caused by influence from an outside of the memory cell area. Therefore, the dummy pattern disclosed in these patent publications do not have an object of relaxing the stress.

As seen from the above, in a semiconductor device having a repetitive pattern area in which a unitary wiring pattern are repeatedly arranged and covered with a plurality of insulator films, according to the present invention, a plurality of dummy wiring conductors formed of the same layer as that of conductors of the wiring pattern are formed in an area adjacent to an edge zone of the repetitive pattern area. With this arrangement, the dummy wiring conductors can realize the stress which acts on the wiring pattern because of the shrinkage of the insulator film occurring at the time of reflow. Thus, the shifting of the patterned wiring conductors can be prevented to avoid the short-circuiting in the semiconductor device, with the result that reliability of the semiconductor device can be elevated..

The invention has thus been shown and described with reference to the specific embodiments. However, it should be noted that the present invention is in no way limited to the details of the illustrated structures but changes and modifications may be made within the scope of the appended claims.

I claim:

1. A semiconductor device, comprising:
   a first impurity diffused region and a second impurity diffused region arranged in a repetitive pattern area;
   a plurality of wiring patterns formed in said repetitive pattern area and extending over a distance from said first impurity diffused region to said second impurity diffused region; and
   a dummy wiring conductor formed in an area adjacent to an edge zone of said repetitive pattern area, said dummy wiring conductor extending parallel to said plurality of wiring patterns over said distance.

2. A semiconductor device claimed in claim 1, further comprising a plurality of insulator films covering said plurality of wiring patterns, the plurality of insulator films comprising a stacked layer of a silicon oxide film and a TEOSBPSG film, respectively.

3. A semiconductor device claimed in claim 1, wherein the dummy wiring conductor is formed of the same wiring material as the wiring patterns.

4. A semiconductor device claimed in claim 1, wherein said wiring patterns include a fuse formed for a redundant circuit of a semiconductor memory, and therein, a silicon oxide film is formed on said fuse, and a TEOSBPSG film is formed on said silicon oxide film, and an aperture is selectively formed to reach from a surface of the semiconductor memory to a depth near to an upper surface of said fuse.

5. A semiconductor device claimed in claim 1, wherein the ratio of width to length of said dummy conductor is made not greater than 1:20.

6. A semiconductor device claimed in claim 5, wherein said dummy wiring conductor is one of at least fifteen dummy wiring conductors.

7. A semiconductor device having a repetitive pattern area and a peripheral zone adjacent to the repetitive pattern area, the device comprising:
   a plurality of wiring patterns formed in the repetitive pattern area; and
   means, disposed in the peripheral zone, for suppressing shifting of said plurality of wiring patterns when said device is subjected to heat treatment.

8. The semiconductor device claimed in claim 7, further comprising an insulator film disposed on said plurality of wiring patterns and on said means for suppressing, said means for suppressing being shifted by shrinkage of said insulator film during heat treatment.

9. The semiconductor device claimed in claim 7, wherein said means for suppressing extends parallel to said plurality of wiring patterns.

10. The semiconductor device claimed in claim 9, wherein said means for suppressing and said plurality of wiring patterns are formed of a same layer.

11. The semiconductor device claimed in claim 7, wherein said means for suppressing comprises a wiring pattern which extends parallel to said plurality of wiring patterns.

12. A method of forming a semiconductor device, comprising the steps of:
   forming a wiring conducting layer comprising patterned wiring conductors and patterned dummy conductors;
   forming an insulator layer over said wiring conductor layer; and
   heat-treating the semiconductor device, causing the insulating layer to shrink such that the patterned dummy conductors shift more than the patterned wiring conductors.

13. The method claimed in claim 12, wherein each of said patterned dummy conductors is formed to extend in parallel with said patterned wiring conductors.

14. A semiconductor device, comprising:
   a repetitive pattern area in which unitary wiring patterns are repeatedly arranged and covered with a plurality of insulator films; and
   a plurality of dummy wiring conductors formed of the same layer as said unitary wiring patterns in an area adjacent to an edge zone of said repetitive patterns area of said unitary wiring patterns, wherein said dummy wiring conductors are disposed parallel to said unitary wiring patterns, and a ratio of width to length of said dummy conductors is not greater than 1:20.

15. The semiconductor device claimed in claim 14, wherein the plurality of insulator films comprises a stacked layer of a silicon oxide film and a TEOSBPSG film.

16. The semiconductor device claimed in claim 14, wherein the dummy wiring conductors are formed of the same wiring material as that of the unitary wiring patterns.

17. The semiconductor device claimed in claim 14, wherein said unitary wiring patterns include a fuse formed for a redundant circuit of a semiconductor memory, and therein, a silicon oxide film is formed on said fuse, and a TEOSBPSG film is formed on said silicon oxide film, and an aperture is selectively formed to reach from a surface of the semiconductor memory to a depth near to an upper surface of said fuse.

18. The semiconductor device claimed in claim 14, wherein said dummy wiring conductors include at least fifteen dummy wiring conductors.

* * * * *